US008963286B2

(12) United States Patent
Lin et al.

(10) Patent No.: US 8,963,286 B2
(45) Date of Patent: Feb. 24, 2015

(54) FINGER METAL OXIDE METAL CAPACITOR STRUCTURES

(75) Inventors: Hung Sheng Lin, San Jose, CA (US);
Shingo Hatanaka, San Jose, CA (US);
Shafiq M. Jamal, Pleasanton, CA (US)

(73) Assignee: Marvell International Ltd., Hamilton (BM)

( * ) Notice: Subject to any disclaimer, the term of this patent is extended or adjusted under 35 U.S.C. 154(b) by 15 days.

(21) Appl. No.: 13/465,605

(22) Filed: May 7, 2012

(65) Prior Publication Data

US 2012/0286393 A1    Nov. 15, 2012

Related U.S. Application Data

(60) Provisional application No. 61/484,102, filed on May 9, 2011.

(51) Int. Cl.
| | | |
|---|---|---|
| *H01L 21/02* | (2006.01) | |
| *H01L 23/522* | (2006.01) | |
| *H01L 49/02* | (2006.01) | |

(52) U.S. Cl.
CPC ........ H01L 23/5223 (2013.01); H01L 23/5225 (2013.01); H01L 28/82 (2013.01); *H01L 28/86* (2013.01); *H01L 28/90* (2013.01)
USPC ............................ 257/532; 257/534; 257/535

(58) Field of Classification Search
CPC . H01L 23/5223; H01L 27/0805; H01L 28/40; H01L 28/86
USPC .......................................... 257/532, 534, 535
See application file for complete search history.

(56) References Cited

U.S. PATENT DOCUMENTS

| | | | |
|---|---|---|---|
| 6,373,087 B1 | 4/2002 | Harris et al. | |
| 7,446,390 B2 | 11/2008 | Okuda et al. | |
| 7,724,174 B2 | 5/2010 | Chang et al. | |
| 8,207,567 B2 | 6/2012 | Chin | |
| 2008/0001255 A1 * | 1/2008 | Okuda et al. | 257/532 |
| 2010/0038752 A1 | 2/2010 | Ng et al. | |
| 2010/0085225 A1 * | 4/2010 | Chang et al. | 341/110 |
| 2010/0271753 A1 | 10/2010 | Wang et al. | |
| 2010/0309605 A1 | 12/2010 | Lin | |

OTHER PUBLICATIONS

Notification of Transmittal of the International Search Report and the Written Opinion of the International Searching Authority, or the Declaration dated Mar. 7, 2013 in reference to PCT/US2012/036897 (10 pgs).

* cited by examiner

*Primary Examiner* — Tucker Wright
*Assistant Examiner* — Mark Hatzilambrou

(57) ABSTRACT

A finger metal oxide metal (MOM) capacitor includes an outer conducting structure defined in a plurality of metal layers and a plurality of via layers of an integrated circuit. First and second side portions include a plurality of first and second finger sections extending in the plurality of metal layers and first and second hole vias connecting the first and second finger sections, respectively. A middle portion connects the first and second side portions. An inner conducting structure is defined in the plurality of metal layers and the plurality of via layers of the integrated circuit. A plurality of "T"-shaped sections are defined in the plurality of metal layers and third hole vias connecting the plurality of "T"-shaped sections. Middle portions of the plurality of "T"-shaped sections extend towards the middle portion and between the first side portion and the second side portion of the outer conducting structure.

7 Claims, 19 Drawing Sheets

FINGER METAL OXIDE METAL CAPACITOR STRUCTURES

CROSS-REFERENCE TO RELATED APPLICATIONS

This application claims the benefit of U.S. Provisional Application No. 61/484,102, filed on May 9, 2011. The disclosure of the above application is incorporated herein by reference in its entirety.

FIELD

The present disclosure relates to capacitors, and more particularly to finger metal oxide metal (MOM) capacitors.

BACKGROUND

The background description provided herein is for the purpose of generally presenting the context of the disclosure. Work of the presently named inventors, to the extent the work is described in this background section, as well as aspects of the description that may not otherwise qualify as prior art at the time of filing, are neither expressly nor impliedly admitted as prior art against the present disclosure.

Circuits such as successive approximation (SAR) analog to digital converters (ADCs) and/or other circuits may include a capacitor array with multiple capacitors. The capacitors in the capacitor array usually have large geometries in order to keep parasitic capacitance below design specifications (usually well below inherent capacitance values). To build the capacitor array with many capacitors, large capacitance values and array area is required, which increases cost.

SUMMARY

A finger metal oxide metal (MOM) capacitor includes an outer conducting structure defined in a plurality of metal layers and a plurality of via layers of an integrated circuit. A first side portion includes a plurality of first finger sections extending in the plurality of metal layers and first hole vias connecting the first finger sections. A second side portion includes a plurality of second finger sections extending in the plurality of metal layers and second hole vias connecting the second finger sections. A middle portion connects the first and second side portions. An inner conducting structure is defined in the plurality of metal layers and the plurality of via layers of the integrated circuit. A plurality of "T"-shaped sections are defined in the plurality of metal layers and third hole vias connecting the plurality of "T"-shaped sections. Middle portions of the plurality of "T"-shaped sections extend towards the middle portion and between the first side portion and the second side portion of the outer conducting structure. Oxide is arranged between the outer conducting structure and the inner conducting structure.

In other features, the middle portion includes conducting sections formed in middle ones of the plurality of metal layers and fourth hole vias connecting the conducting sections. A third finger section and a fourth finger section extend above and below the middle portion, respectively, and are connected to a reference impedance. The third and fourth finger sections are located in a first one and a last one of the plurality of metal layers, respectively.

In other features, a plurality of floating finger sections are arranged in middle ones of the plurality of metal layers between the third finger section and the fourth finger section. A length of the plurality of "T"-shaped sections of the inner conducting structure is varied to vary a capacitance of the finger MOM capacitor.

A capacitor array includes a plurality of the finger MOM capacitors. Each of the plurality of finger MOM capacitors share at least one of the first side portion and second side portion with adjacent ones of the plurality of finger MOM capacitors.

A finger metal oxide metal (MOM) capacitor includes an outer conducting structure defined in a plurality of metal layers and a plurality of via layers of an integrated circuit. A first side portion includes a plurality of first finger sections extending in the plurality of metal layers and first hole vias connecting the first finger sections. A second side portion includes a plurality of second finger sections extending in the plurality of metal layers and second hole vias connecting the second finger sections. A middle portion connects the first and second side portions. An inner conducting structure is defined in the plurality of metal layers and the plurality of via layers of the integrated circuit. A first rectangular section is defined in at least one of the plurality of metal layers. A plurality of "T"-shaped sections are defined in others of the plurality of metal layers. Third hole vias connect the first rectangular section and the plurality of "T"-shaped sections. The plurality of "T"-shaped sections and the first rectangular section extend towards the middle portion and between the first side portion and the second side portion. Oxide is arranged between the outer conducting structure and the inner conducting structure.

In other features, the middle portion includes "T"-shaped elongate sections formed in middle ones of the plurality of metal layers and extending towards the inner conducting structure. A third finger section and a second rectangular section extend above and below the "T"-shaped elongate sections of the middle portion, respectively. The third finger section and the second rectangular section are connected to a reference impedance. The second rectangular section and the third finger section are located in a first one and a last one of the plurality of metal layers, respectively.

In still other features, the first rectangular section and the second rectangular section have a width in the first one of the plurality of metal layers that is greater than a width of a middle leg of the plurality of "T"-shaped sections. Lengths of the plurality of "T"-shaped sections of the inner conducting structure are varied to vary a capacitance of the finger MOM capacitor.

A capacitor array includes a plurality of the finger MOM capacitors. Each of the plurality of finger MOM capacitors share at least one of the first side portion and second side portion with adjacent ones of the plurality of finger MOM capacitors.

A finger metal oxide metal (MOM) capacitor includes a first conducting structure defined in a plurality of metal layers and a plurality of via layers of an integrated circuit. A plurality of first portions extends in a first plane. A plurality of second portions is connected to the plurality of first portions and extends in a second plane that is perpendicular to the first plane. A second conducting structure is defined in the plurality of metal layers and the plurality of via layers of the integrated circuit. A plurality of first portions extends in the second plane. A plurality of second portions is connected to the first portions and extends in a third plane that is perpendicular to the first and second planes. The plurality of second portions of the second conducting structure extends below the plurality of first portions and the plurality of second portions of the first conducting structure. Oxide is arranged between the second conducting structure and the first conducting structure.

In other features, the first conducting structure has an "L"-shaped cross section in the third plane and the second conducting structure has an "L"-shaped cross section in the second plane. The first conducting structure has an "L"-shaped cross section in the third plane and the second conducting structure has an "T"-shaped cross section in the second plane. At least part of the first portions and the second portions of the first conducting structure are fabricated in a metal layer located above a lowest metal layer of the integrated circuit.

In other features, at least part of the first portions and the second portions of the second conducting structure are fabricated in the lowest metal layer of the integrated circuit. The first portions and the second portions of the first conducting structure include conducting sections in the plurality of metal layers that are connected by trench vias in the plurality of via layers. The first portions of the second conducting structure include conducting sections in the plurality of metal layers that are connected by trench vias in the plurality of via layers.

In other features, the first portions and the second portions of the first conducting structure include conducting sections in the plurality of metal layers that are connected by hole vias in the plurality of via layers. The first portions of the second conducting structure include conducting sections in the plurality of metal layers that are connected by hole vias in the plurality of via layers.

Further areas of applicability of the present disclosure will become apparent from the detailed description, the claims and the drawings. The detailed description and specific examples are intended for purposes of illustration only and are not intended to limit the scope of the disclosure.

BRIEF DESCRIPTION OF DRAWINGS

The present disclosure will become more fully understood from the detailed description and the accompanying drawings, wherein.

DESCRIPTION

The present disclosure describes various metal oxide metal (MOM) capacitors that are fabricated in integrated circuits. In some examples of the MOM capacitor according to the present disclosure, an outer conducting structure of the MOM capacitor surrounds an inner conducting structure. Connection is made to the inner conducting structure by one or more conducting extensions that extend through openings in the outer conducting structure. Arrays including two or more MOM capacitors may also be formed. In some examples of the present disclosure, a Faraday wall is arranged adjacent to an outer boundary of the capacitor array to allow connection to the array without increasing parasitic capacitance to surrounding conducting walls of an adjacent array or MOM capacitor.

Figure 1:
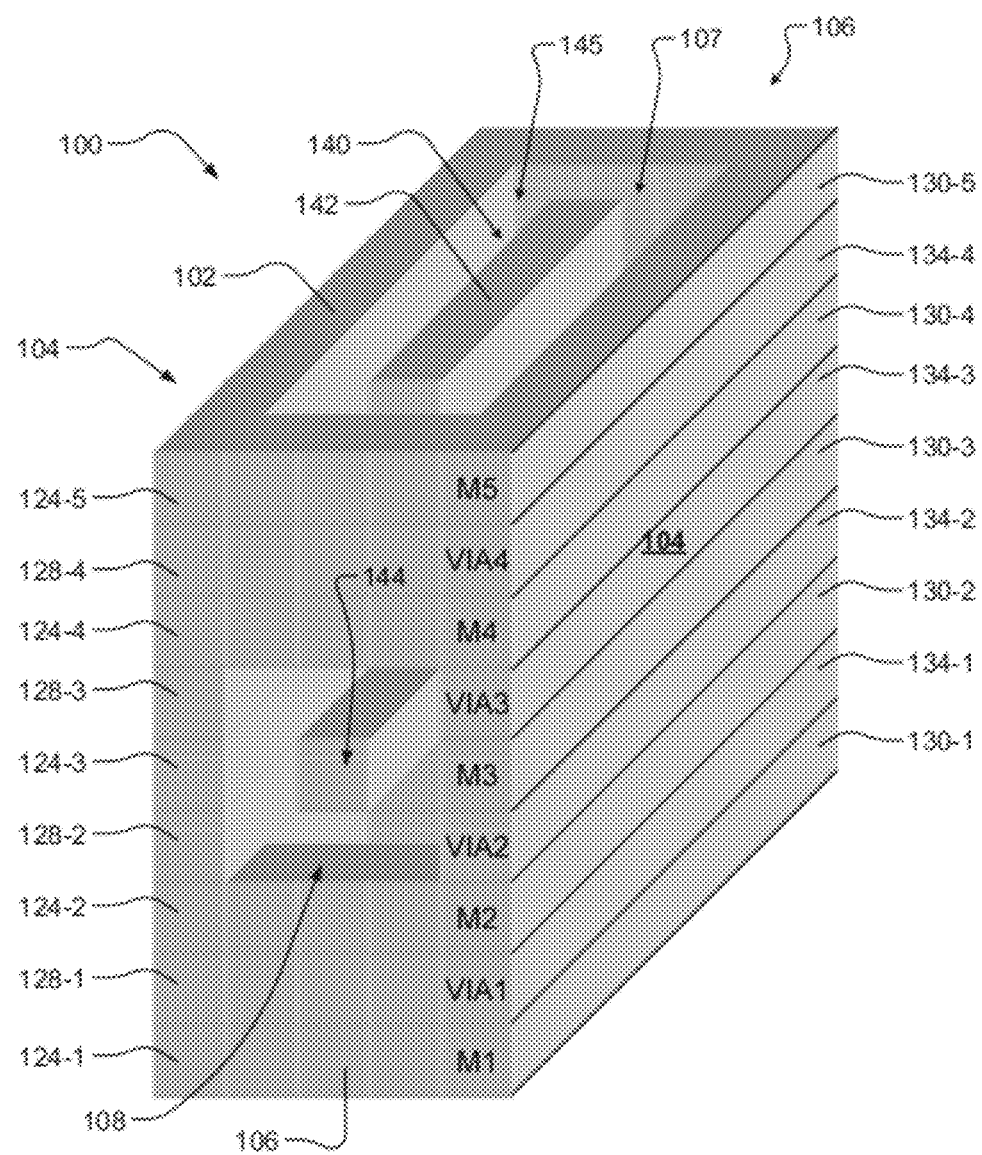
FIG. 1 is a perspective view illustrating a metal oxide metal (MOM) capacitor according to the present disclosure.

Referring now to FIG. 1, a MOM capacitor 100 according to the present disclosure is shown. The MOM capacitor 100 may be fabricated in a multi-layer integrated circuit. The MOM capacitor 100 includes an outer conducting structure 102 with opposing walls 104 and opposing walls 106. The outer conducting structure 102 defines a cavity with top and bottom openings 107. The opposing walls 106 also define openings 108. In the example shown in FIG. 1, the outer conducting structure 102 defines a rectangular box section.

The MOM capacitor 100 is defined in alternating metal layers and via layers of an integrated circuit. More particularly, the MOM capacitor 100 is defined in metal layers 124-1 (or metal 1 (M1)), 124-2 (or M2), 124-3 (or M3), 124-4 (or M4), and 124-5 (or M5) (collectively metal layers 124) and intervening via layers 128-1 (or VIA1), 128-2 (or VIA2), 128-3 (or VIA3), and 128-4 (or VIA4) (collectively via layers 128). While five metal layers are shown, additional or fewer metal layers and intervening via layers may be used to create the MOM capacitor 100.

As used herein, the term "hole via" refers to a conventional via that normally has a generally square shape. The term "trench via" refers to a conventional via that has been oversized in one or more directions.

Each of the opposing walls 104 and 106 of the outer conducting structure 102 includes conducting sections 130-1, 130-2, 130-3, 130-4, and 130-5 (collectively conducting sections 130) defined in metal layers 124-1, 124-2, 124-3, 124-4, and 124-5, respectively. Each of the opposing walls 106 and 108 of the outer conducting structure 102 includes trench vias 134-1, 134-2, 134-3, and 134-4 (collectively trench vias 134) defined in via layers 128-1, 128-2, 128-3, and 128-4, respectively.

The MOM capacitor 100 further includes an inner conducting structure 140 that is arranged inside of the outer conducting structure 102. The inner conducting structure 140 includes a center section 142 and conducting extensions 144 that extend from the center section 142 through the openings 108 in the outer conducting structure 102. In some examples, the center section 142 has a rectangular shape. While one conducting extension is shown at each side, additional conducting extensions can be used. Likewise, while the location of the conducting extensions 144 is shown centered along sides of the inner conducting structure 140, the location of the conducting extensions 144 can be in any of the metal layers. Because the conducting extensions 144 extend through the walls 106, the inherent capacitance of the connection to the inner conducting structure is minimized or eliminated as compared to convention connections which tend to have higher parasitic capacitance. This higher parasitic capacitance of conventional designs is further increased when scaled into capacitance arrays.

Oxide-based material 145 is located in areas other than the outer conducting structure 102 and the inner conducting structure 140 and connections thereto.

Figure 2:
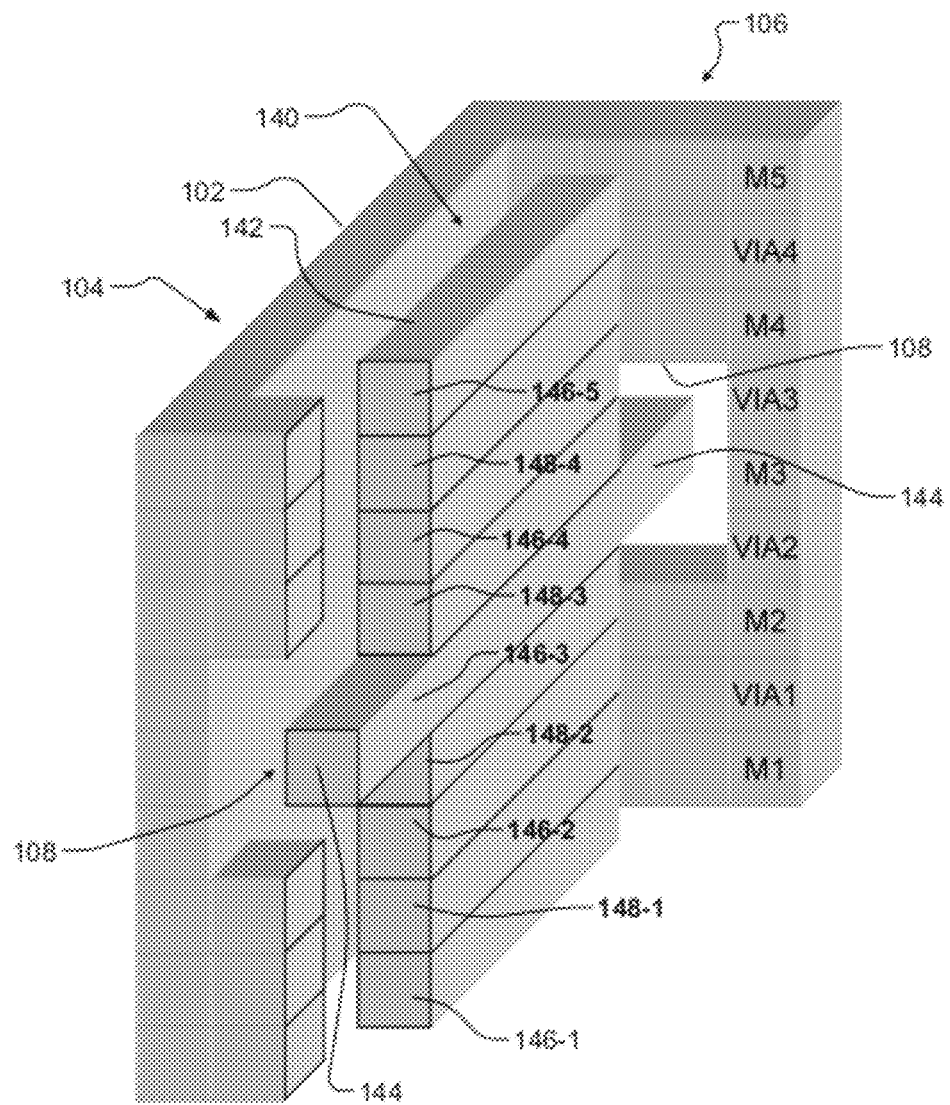
FIG. 2 is a partial perspective view illustrating the MOM capacitor of FIG. 1.

Referring now to FIG. 2, the inner conducting structure 140 can be seen in more detail. As can be seen, the conducting extensions 144 extend through the openings 108. The center section 142 includes aligned, rectangular conducting sections 146-1, 146-2, 146-3, 146-4, and 146-5 (collectively conducting extensions 146) (in metal layers 124-1, 124-2, 124-3, 124-4, and 124-5, respectively). The center section 142 includes aligned, rectangular trench vias 148-1, 148-2, 148-3, and 148-4 (collectively trench vias 148) (in via layers 128-1, 128-2, 128-3, and 128-4, respectively).

Figure 3:
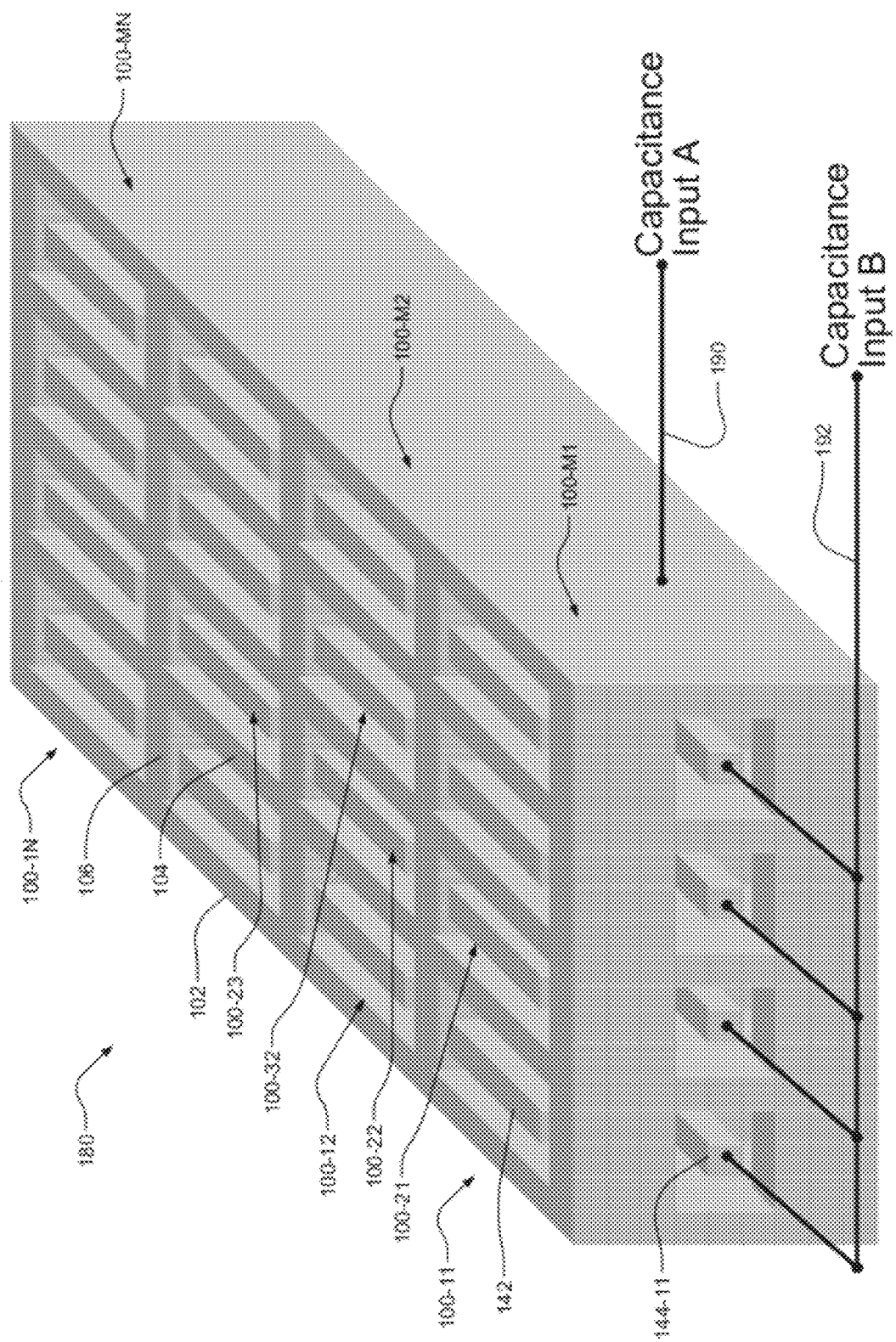
FIG. 3 is a perspective view illustrating an array of the MOM capacitors of FIG. 1.
Figure 4:
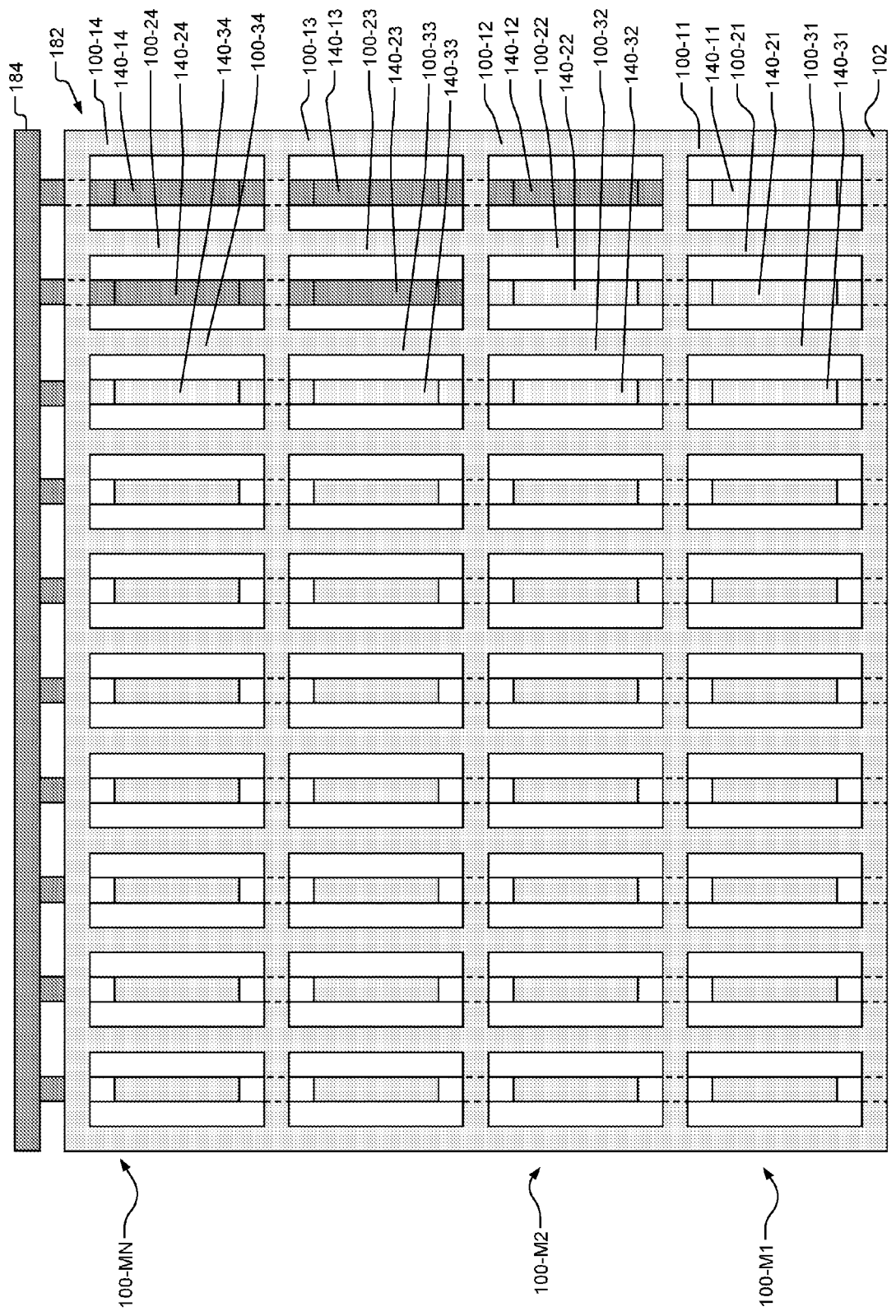
FIG. 4 is a plan view illustrating the array of FIG. 3.

Referring now to FIGS. 3-4, the MOM capacitor 100 of FIG. 1 can be implemented in an array 180. The array 180 includes a plurality of MOM capacitors 100-11, 100-12, . . . and 100-MN (collectively MOM capacitors 100). Each of the MOM capacitors 100 shares at least two of opposing walls 104 and 106 with adjacent ones of the MOM capacitors 100. For example only, the MOM capacitor 100-22 shares walls with the MOM capacitor 100-21, the MOM capacitor 100-12, the MOM capacitor 100-23 and the MOM capacitor 100-32.

Zero or more of the MOM capacitors 100 in a column (such as MOM capacitors 100-11 to 100-1N) may be connected by the conducting extensions 144 through corresponding ones of the openings 108. Connections between columns may be made by a connection that is external to the array 180. For example in FIG. 3, external connections 190 and 192 may be used to connect signals to selected capacitors in the capacitor array 180.

As can be seen in FIG. 4, the connections between the MOM capacitors 100 in a column may be varied to adjust the capacitance of the column. Likewise, the connections between capacitors in adjacent columns may be varied to adjust the overall capacitance of an array 182. In the example in FIG. 4, the inner conducting structures 140-12, 140-13, 140-14, 140-23 and 140-24 associated with MOM capacitors 100-12, 100-13, 100-14, 100-23 and 100-24, respectively, are connected to a low impedance reference 184 (at a top of the array 182). The inner conducting structures 140-34, 140-33, 140-32, 140-31, 140-22, 140-21 and 140-11 associated with MOM capacitors 100-34, 100-33, 100-32, 100-31, 100-22, 100-21 and 100-11, respectively, are connected to one input of the capacitor array 1820 (connection not shown). The outer conducting structures 102 for all of the MOM capacitors 100 are connected together and to another input of the capacitor array 182 (connection not shown).

Figure 5:
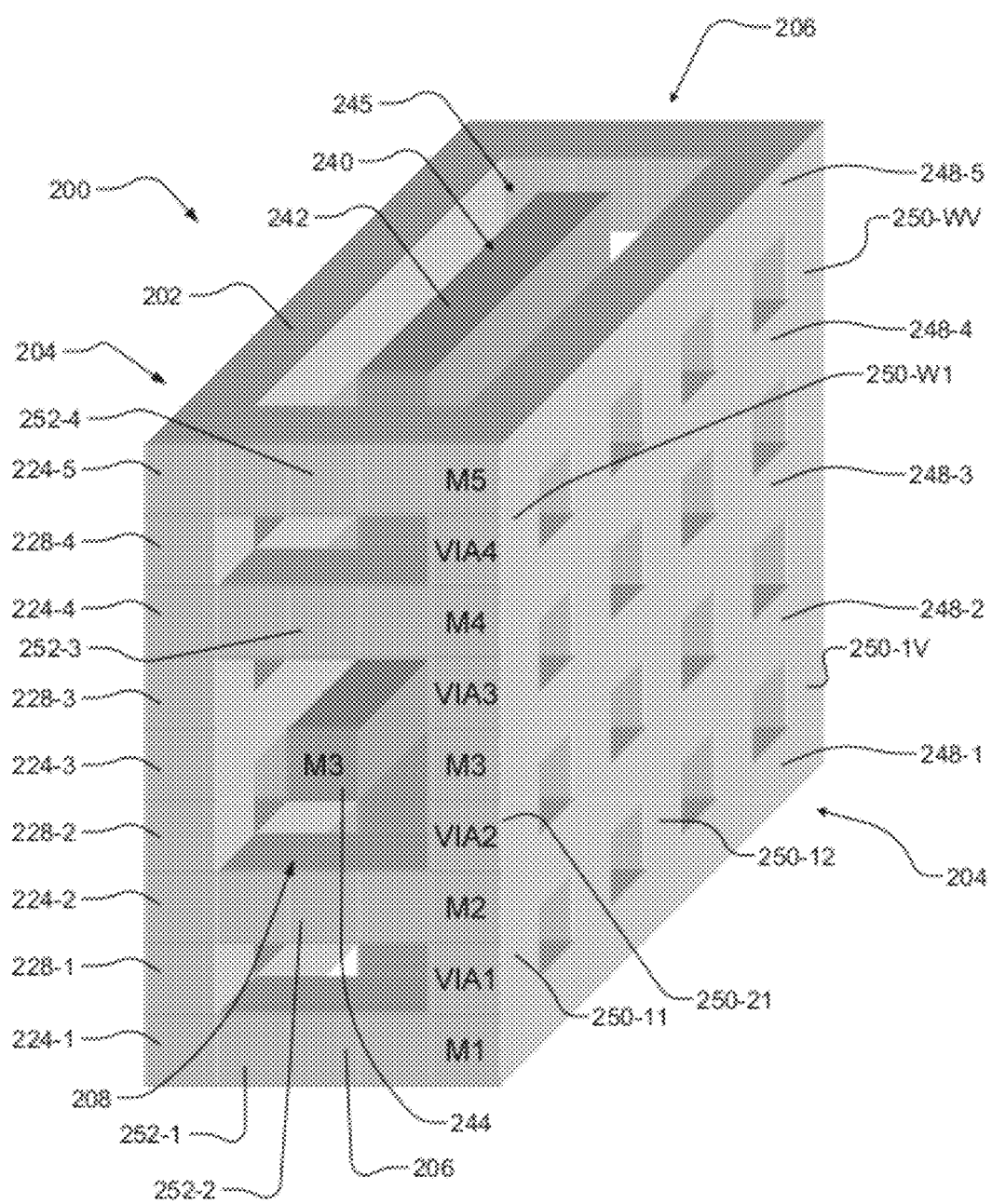
FIG. 5 is a perspective view illustrating another MOM capacitor according to the present disclosure.
Figure 6:
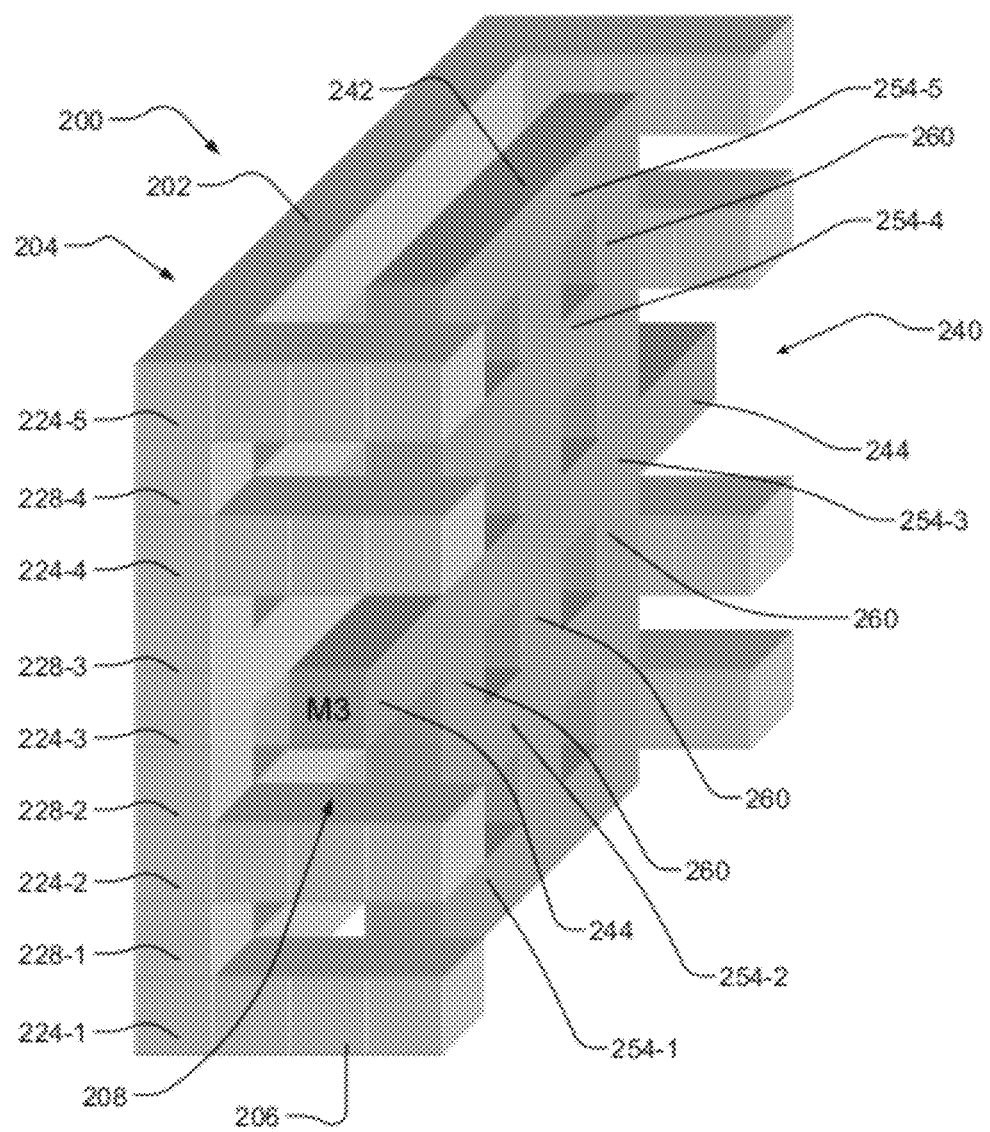
FIG. 6 is a partial perspective view illustrating the MOM capacitor of FIG. 5.

Referring now to FIGS. 5-6, a MOM capacitor 200 that is similar to the MOM capacitor 100 in FIG. 1 is shown. The MOM capacitor 200 employs hole vias rather than trench vias to increase spacing between vias. Increasing spacing between vias tends to reduce the chance of a short due to misalignment during fabrication. The MOM capacitor 200 may be fabricated in a multi-layer integrated circuit. In FIG. 5, the MOM capacitor 200 includes an outer conducting structure 202. The outer conducting structure 202 includes opposing walls 204 and opposing walls 206.

The MOM capacitor 200 includes metal layers 224-1 (or MD), 224-2 (or M2), 124-3 (or M3), 224-4 (or M4), and 224-5 (or M5) (collectively metal layers 224) with intervening via layers 228-1 (or VIA1), 228-2 (or VIA2), 228-3 (or VIA3), and 228-4 (or VIA4) (collectively via layers 228). While five metal layers are shown, additional or fewer metal layers and intervening via layers may be used.

The sidewalls 204 define a lattice-like structure including conducting sections 248-1, 248-2, 248-3, 248-4 and 248-5 (collectively referred to as conducting sections 248) in the metal layers 224-1, 224-2, 224-3, 224-4 and 224-5, respectively, and spaced hole vias 250-11, 250-12, . . . , and 250-WV (collectively referred to as hole vias 250) in the via layers 228-1, 228-2, 228-3, 228-4, and 228-5, respectively.

The opposing walls 206 are defined by conducting sections 252-1, 252-2, 252-3, and 252-4 in the metal layers 224-1, 224-2, 224-4 and 224-5, respectively. The spaced hole vias 250-11, 250-21, . . . and 250-W1 and 250-1V, 250-2V, . . . and 250WV may be arranged in corners of the outer conducting structure 202. An elongate conducting section is omitted in the metal layer 224-3 to allow conducting extensions 244 to pass through an opening 208 in the opposing walls 206. Oxide 245 is located between the inner and outer conducting structures 240 and 202.

In FIG. 6, an inner conducting structure 240 is arranged inside of the outer conducting structure 202 and includes a center section 242 and the conducting extensions 244. As can be seen, the conducting extensions 244 extend through opposing walls 206. The center section 242 defines a lattice structure including elongate conducting sections 254-1, 254-2, 254-3, 254-4 and 254-5 (collectively conducting extensions 254) in the metal layers 224 and spaced hole vias 260 in the via layers 228. In the example in FIGS. 5-6, while three hole vias are used in each of the via layers of the inner conducting structure, additional or fewer hole vias can be used. Alternately, combinations of hole vias and trench vias may be used in any of the via layers in the inner and outer conducting structures described herein.

The oxide-based material 245 is located in areas other than the outer conducting structure 202 and the inner conducting structure 240 and connections thereto. The number of column vias and the spacing between the columns can be adjusted to be greater than or less than the number and spacing depicted in FIGS. 5-6.

Figure 7:
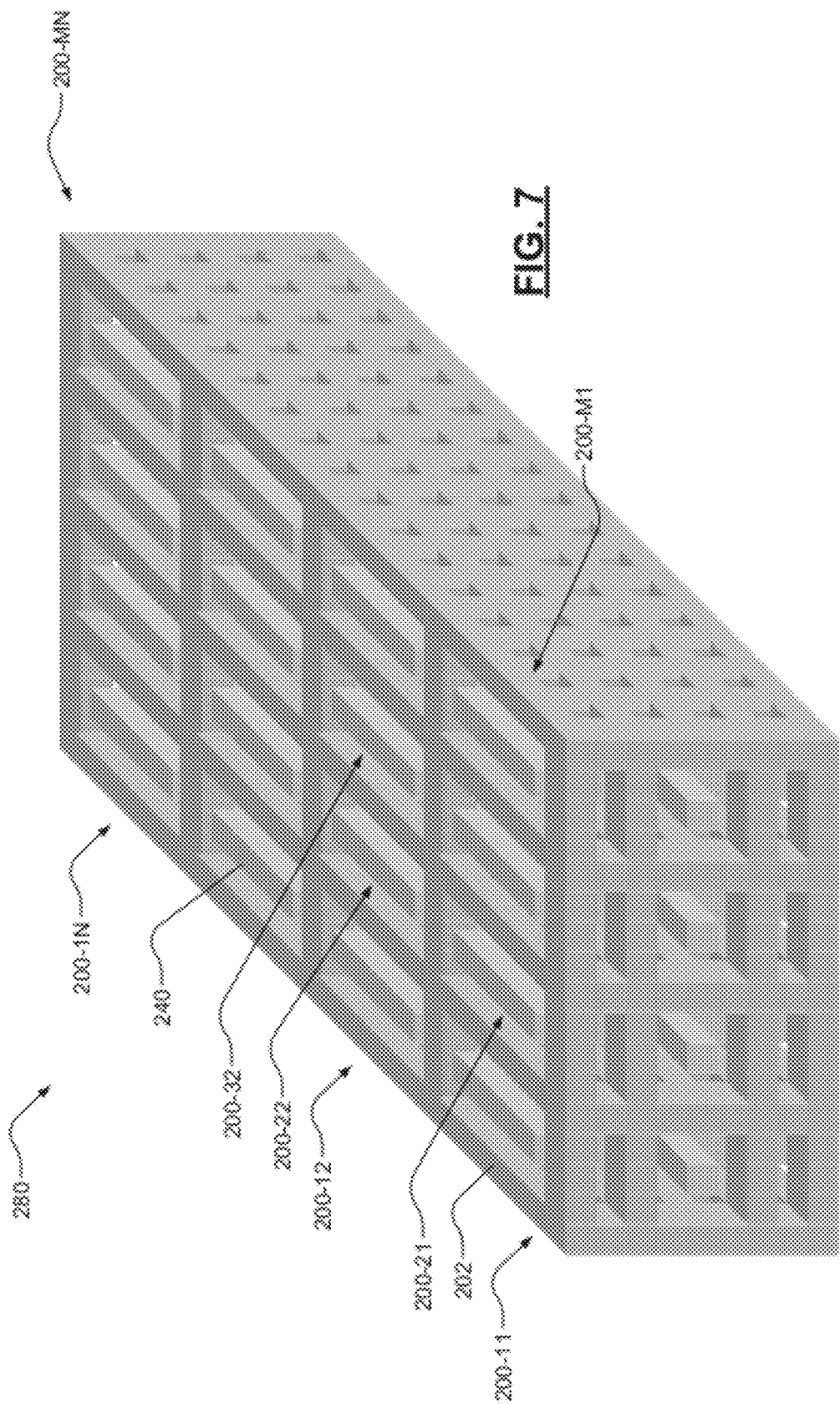
FIG. 7 is a perspective view illustrating an array of the MOM capacitors of FIG. 5.

Referring now to FIG. 7, the MOM capacitor 200 of FIG. 5 can be implemented in a MOM capacitor array 280. The MOM capacitor array 280 includes a plurality of MOM capacitors 200-11, 200-12, . . . and 200-MN. Each of the MOM capacitors 200 shares at least two of opposing walls 204 and opposing walls 206 with adjacent ones of the MOM capacitors 200. For example only, the MOM capacitor 200-22 shares walls with the MOM capacitor 200-21, the MOM capacitor 200-12, the MOM capacitor 200-23 and the MOM capacitor 200-32. The MOM capacitors 200 in a column (such as MOM capacitors 200-11 to 200-1N) may be selectively connected by the conducting extensions 244.

Connections between columns are made by a connection (not shown) external to the array 280. The connections between the MOM capacitors in a column may be varied to adjust the capacitance of the column. Likewise, the connections between capacitors in adjacent columns may be varied to adjust the overall capacitance of the array 280. Connections to the MOM capacitor array 280 may be made in a manner similar to that shown in FIGS. 3-4.

Figure 8:
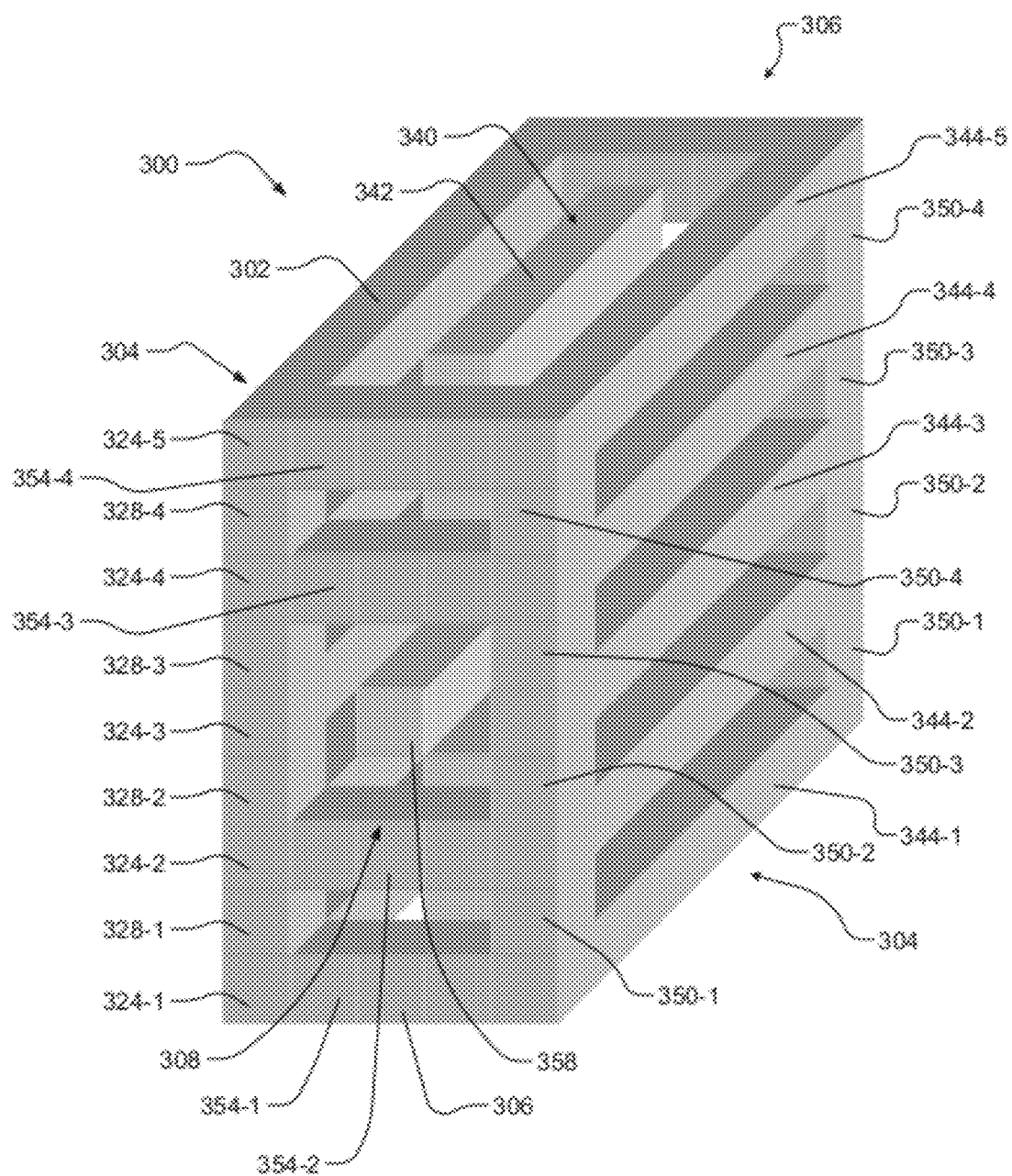
FIG. 8 is a perspective view illustrating another MOM capacitor according to the present disclosure.

Referring now to FIG. 8, a MOM capacitor 300 according to the present disclosure is shown. The MOM capacitor 300 is similar to the MOM capacitor 200 but with increased via spacing. The MOM capacitor 300 may be fabricated in a multi-layer integrated circuit. The MOM capacitor 300 includes an outer conducting structure 302 with opposing walls 304 and opposing walls 306.

The MOM capacitor 300 includes metal layers 324-1 (or M1), 324-2 (or M2), 324-3 (or M3), 324-4 (or M4), and 324-5 (or M5) (collectively metal layers 324) with intervening via layers 328-1 (or VIA1), 328-2 (or VIA2), 328-3 (or VIA3), and 328-4 (or VIA4) (collectively via layers 328). While five metal layers are shown, additional or fewer metal layers and intervening via layers may be used.

The sidewalls 304 define elongate conducting sections 344-1, 344-2, 344-3, 344-4, and 344-5 (collectively conducting sections 344) in the metal layers 324 and spaced hole vias 350-1, 350-2, 350-3, and 350-4 (collectively hole vias 350) arranged in corners of the outer conducting structure 302. The opposing walls 306 include elongate conducting sections 354-1, 354-2, 354-3, 354-4, and 354-5 (collectively conducting sections 354) in the metal layers 324-1, 324-2, 324-4 and 324-5, respectively. An elongate conducting section is missing in the metal layer 324-3 to allow conducting extensions 358 to pass through the opposing walls 306 of the outer conducting structure 302.

Figure 9:
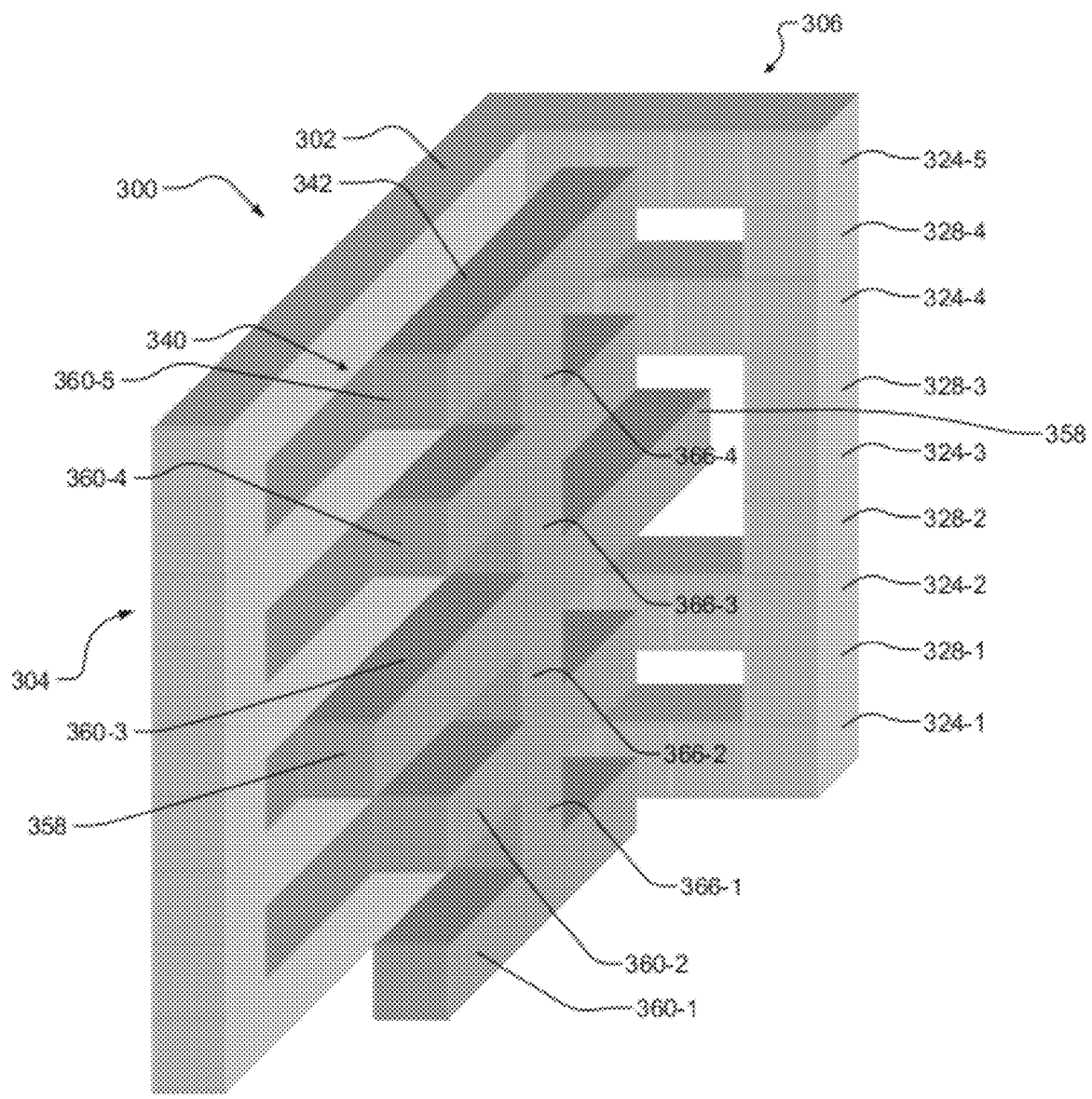
FIG. 9 is a partial perspective view illustrating the MOM capacitor of FIG. 8.

Referring now to FIG. 9, an inner conducting structure 340 is arranged inside of the outer conducting structure 302 and includes a center section 342 and the conducting extensions 358. As can be seen, the conducting extensions 358 extend through the opposing walls 306 of the outer conducting structure 302. The center section 342 includes elongate conducting sections 360-1, 360-2, . . . , and 360-5 (collectively elongate sections 360) in the metal layers 324 and hole vias 366-1, 366-2, 366-3, and 366-4 (collectively hole vias 366). The hole vias 366 may be arranged in a column in the via layers 328 in a center of the inner conducting structure 340, although other locations may be suitable.

Figure 10:
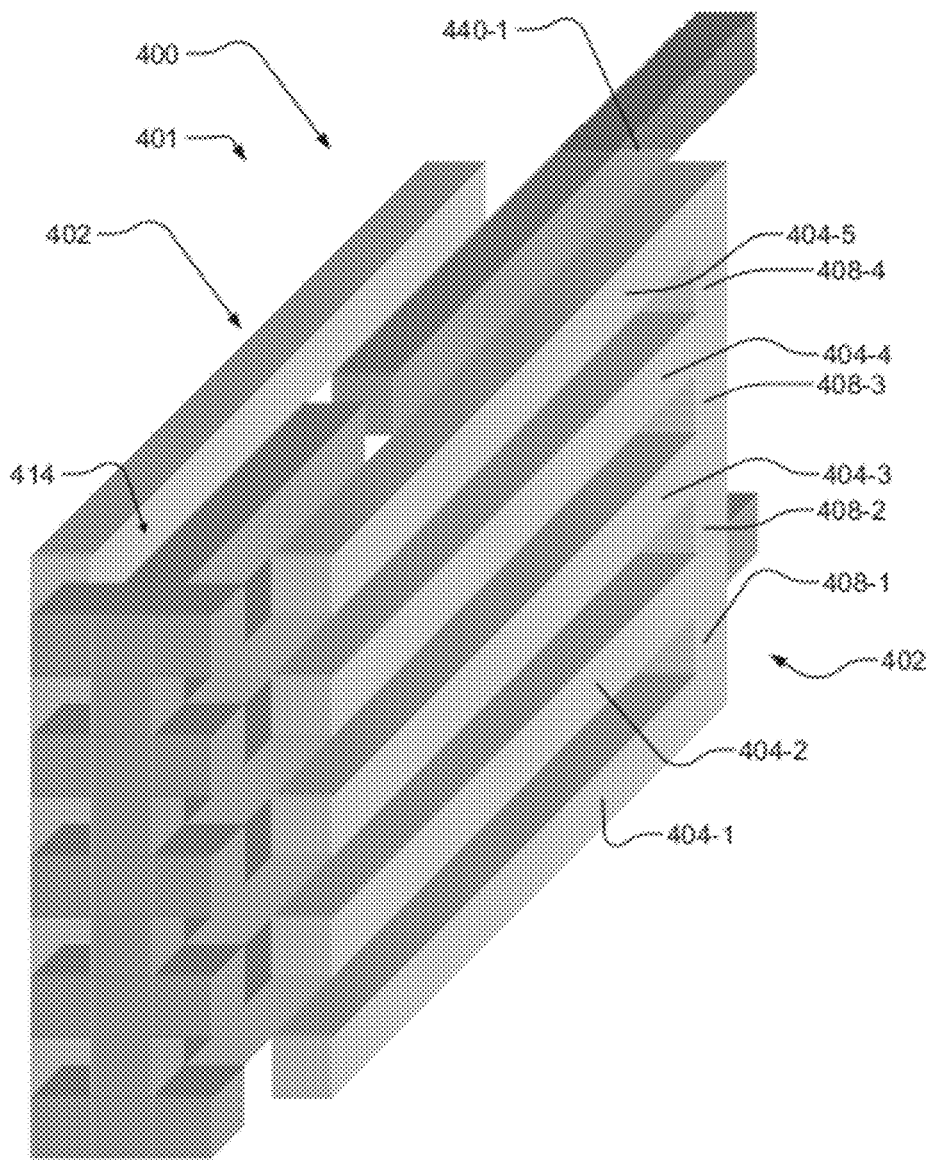
FIG. 10 is a perspective view illustrating a finger MOM capacitor according to the present disclosure.
Figure 11:
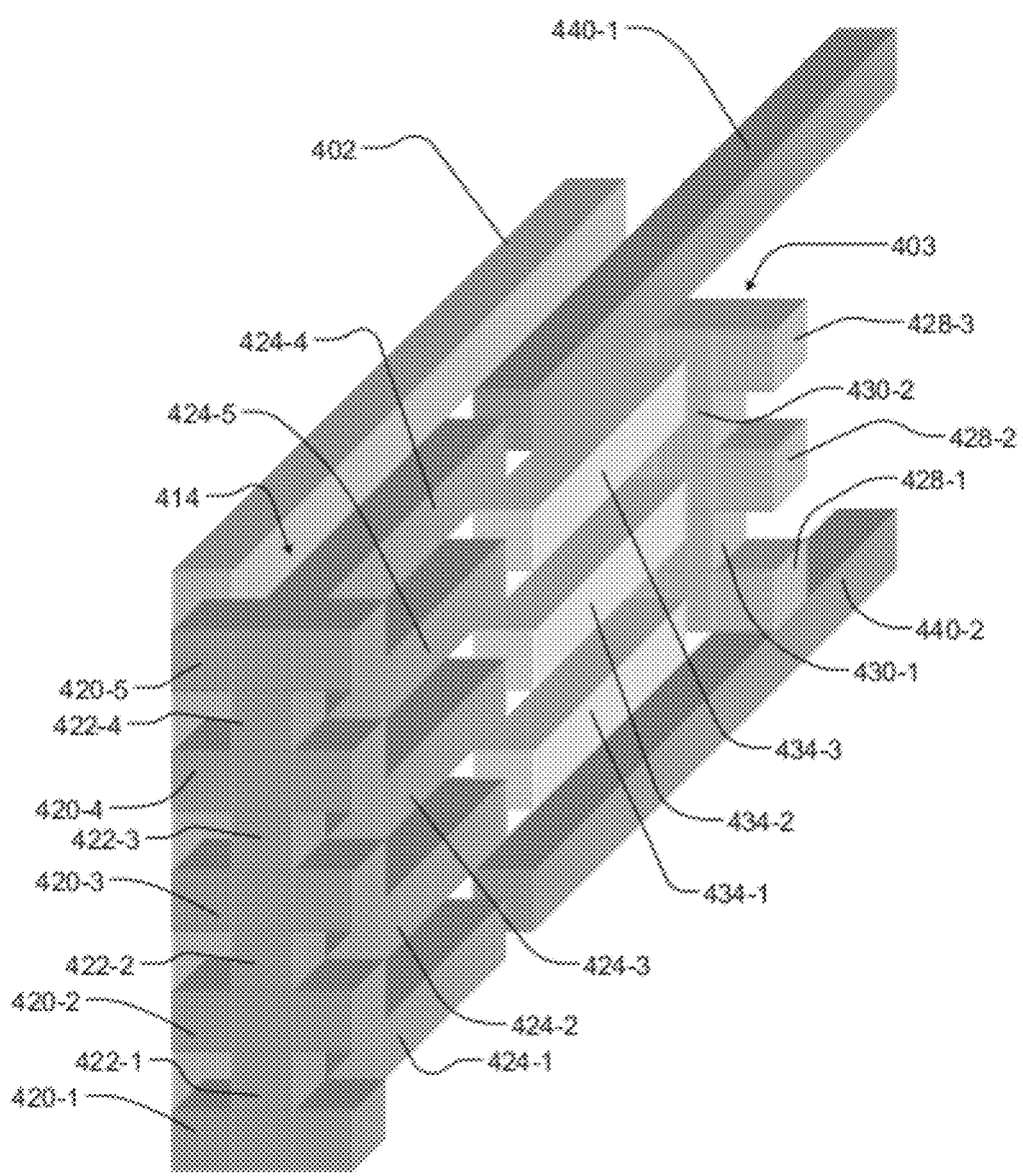
FIG. 11 is a partial perspective view illustrating the finger MOM capacitor of FIG. 10.

Referring now to FIGS. 10-11, a finger MOM capacitor 400 according to the present disclosure is shown. In FIG. 10, the finger MOM capacitor 400 includes an outer conducting structure 401 including first and second side portions 402 that are connected by a middle portion 403 (best seen in FIG. 11). In FIG. 10, each of the first and second side portions 402 includes elongate finger sections 404-1 (in M1), 404-2 (in M2), 404-3 (in M3), 404-4 (in M4), and 404-5 (in M5) (collectively finger sections 404) with connecting hole vias 408-1 (in VIA1), 408-2 (in VIA2), 408-3 (in VIA3), and 408-4 (in VIA4) (collectively hole vias 408). While five metal layers are shown, additional or fewer metal layers and intervening via layers may be used. While a single column of the hole vias 408 is shown for each of the first and second side portions 402-1 and 402-2, one or more columns of hole vias 408 may be used. For example, the column of hole vias 408 may be arranged at ends of the elongate sections 404 or in other locations.

In FIG. 11, an inner conducting structure 414 includes "T"-shaped sections 420-1 (in M1), 420-2 (in M2), 420-3 (in M3), 420-4 (in M4), and 420-5 (in M5) (collectively "T"-shaped sections 420) with connecting hole vias 422-1 (in VIA1), 422-2 (in VIA2), 422-3 (in VIA3), and 422-4 (in VIA4) (collectively hole vias 422). Middle sections 424-1, 424-2, 424-3, 424-4 and 424-5 (collectively middle sections 424) of the "T"-shaped sections 420 extend into a central area defined between the first and second side portions 402 and the middle portion 403. While a single column of the hole vias 422 is shown, one or more columns of hole vias 422 or trench vias may be used. The column of hole vias 422 may be arranged at an end of the middle sections 424 or in other locations.

The middle portion 403 includes conducting sections 428-1 (in M2), 428-2 (in M3), and 428-3 (in M4) (collectively elongate sections 428) with connecting hole vias 430-1 (in VIA2) and 430-2 (in VIA3) (collectively hole vias 430). While a single column of the hole vias 430 is shown, one or more columns of hole vias or trench vias may be used. The column of hole vias may be arranged at a center of the elongate sections 428.

Floating finger sections 434-1, 434-2 and 434-3 may be arranged in the metal layers between the "T"-shaped sections 420-2, 420-3 and 420-4 and the middle portion 403. Finger sections 440-1 and 440-2 may be arranged above and below the middle portion 403 and in line with "T"-shaped sections 420-1 and 420-5, respectively. In some examples, the finger sections 440-1 and 440-2 may be connected to a low impedance reference. In some examples, the finger sections 440-1 and 440-2 may have a rectangular cross section.

Figure 12:
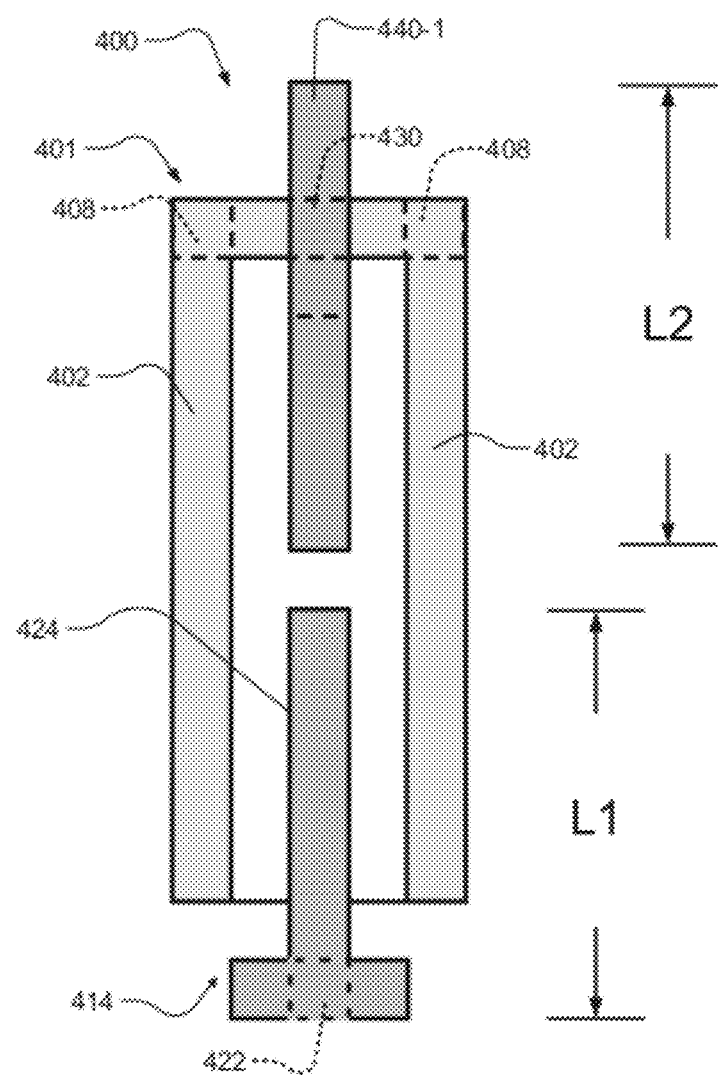
FIG. 12 is a plan view illustrating the finger MOM capacitor of FIG. 10.

Referring now to FIG. 12, the relative lengths of the inner conducting structure 414, the finger sections 440-1 and 440-2, and the floating finger sections 434-1, 434-2 and 434-3 may be adjusted to vary a capacitance of the finger MOM capacitor 400. As can be appreciated, the via separation in the finger MOM capacitor 400 is relatively high. There are no vias inside of the finger MOM capacitor 400. The hole vias 422 are spaced at the opposite end of the finger MOM capacitor 400 in relation to the hole vias 408 and 430. As the length of the "T"-shaped sections 420 increases to a maximum length, the length of the floating fingers 434 may be reduced to zero.

Figure 13:
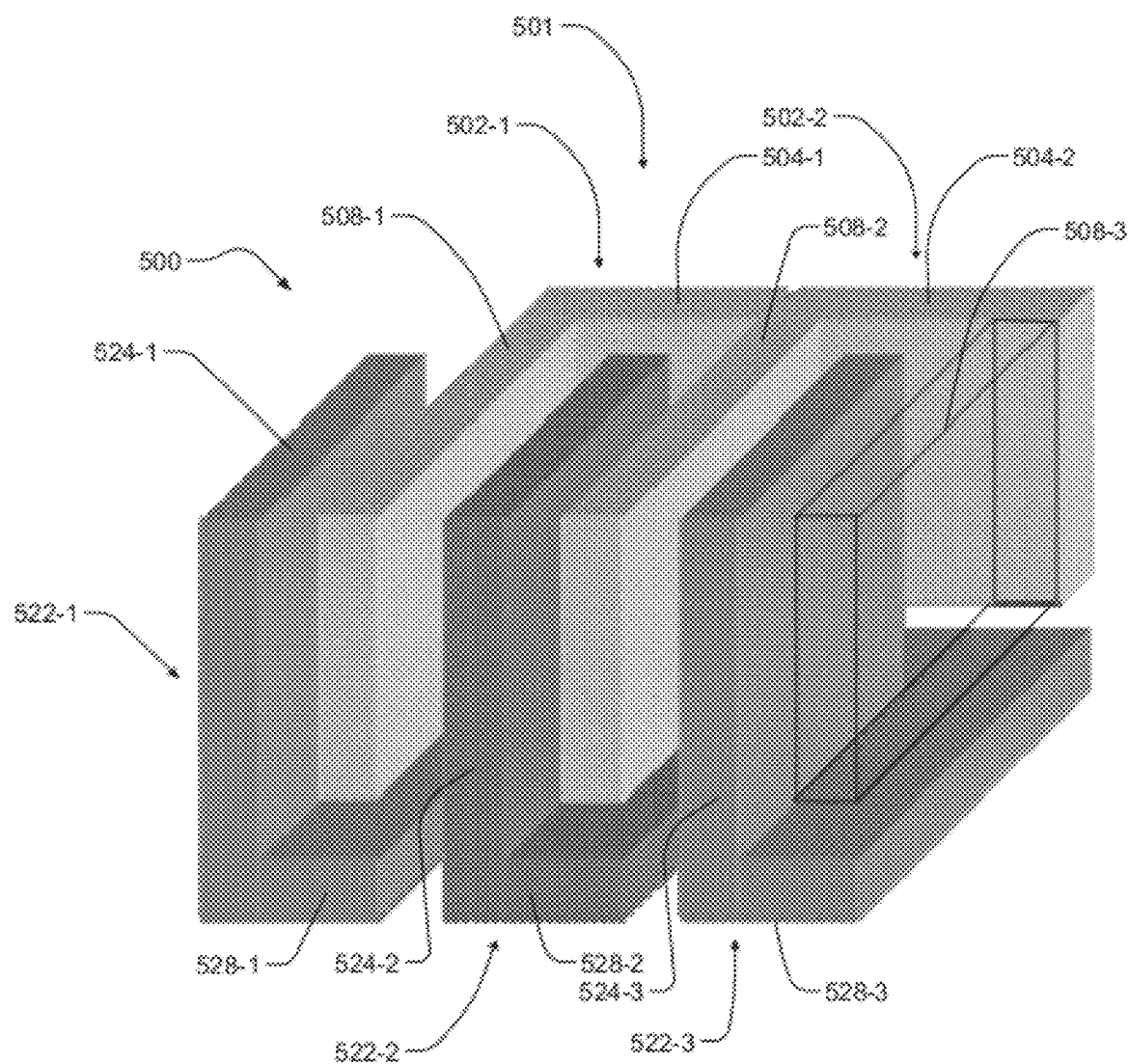
FIG. 13 is a perspective view illustrating another finger MOM capacitor according to the present disclosure.

Referring now to FIG. 13, a finger MOM capacitor 500 according to the present disclosure is shown. The finger MOM capacitor 500 includes a finger structure 501 with a plurality of first conducting structures 502-1, 502-2, . . . (collectively first conducting structures 502). Each of the first conducting structures 502-1, 502-2, . . . includes corresponding first portions 504-1, 504-2, . . . (collectively first portions 504) extending in a first plane that are connected to corresponding second portions 508-1, 508-2, . . . (collectively second portions 508) extending in a second plane that is perpendicular to the first plane. Adjacent ones of the first conducting structures 502 may be connected together at a junction between the first portions 504 and the second portions 508. The first conducting structures 502 can be "L"-shaped. The finger structure 501 may be made in a metal layer above a lowest metal layer used to fabricate the finger MOM capacitor 500. In conventional designs, the finger structure 501 tends to have parasitic capacitance with underlying layers such as substrate or ground well layers.

The finger MOM capacitor 500 further includes a plurality of second conducting structures 522-1, 522-2, 522-3, . . . (collectively second conducting structures 522) each including corresponding first portions 524-1, 524-2, 524-3 . . . (collectively first portions 524) extending in the second plane that are connected to corresponding second portions 528-1, 528-2, 528-3, . . . (collectively second portions 528) extending in a third plane that is perpendicular to the first and second planes. The second conducting structures 522 may have an "L"-shaped cross-section in one plane. An end of the second portions 528 (e.g., as shown on the second portion 528-3) extends below corresponding ones of the second portions 504 of the first conducting structures 502. In some examples, the third plane corresponds to the first metal layer used to fabricate the finger MOM capacitor 500. The second portions 528 tend to limit parasitic capacitance that would otherwise occur between the finger structure 501 and underlying layers.

Figure 14:
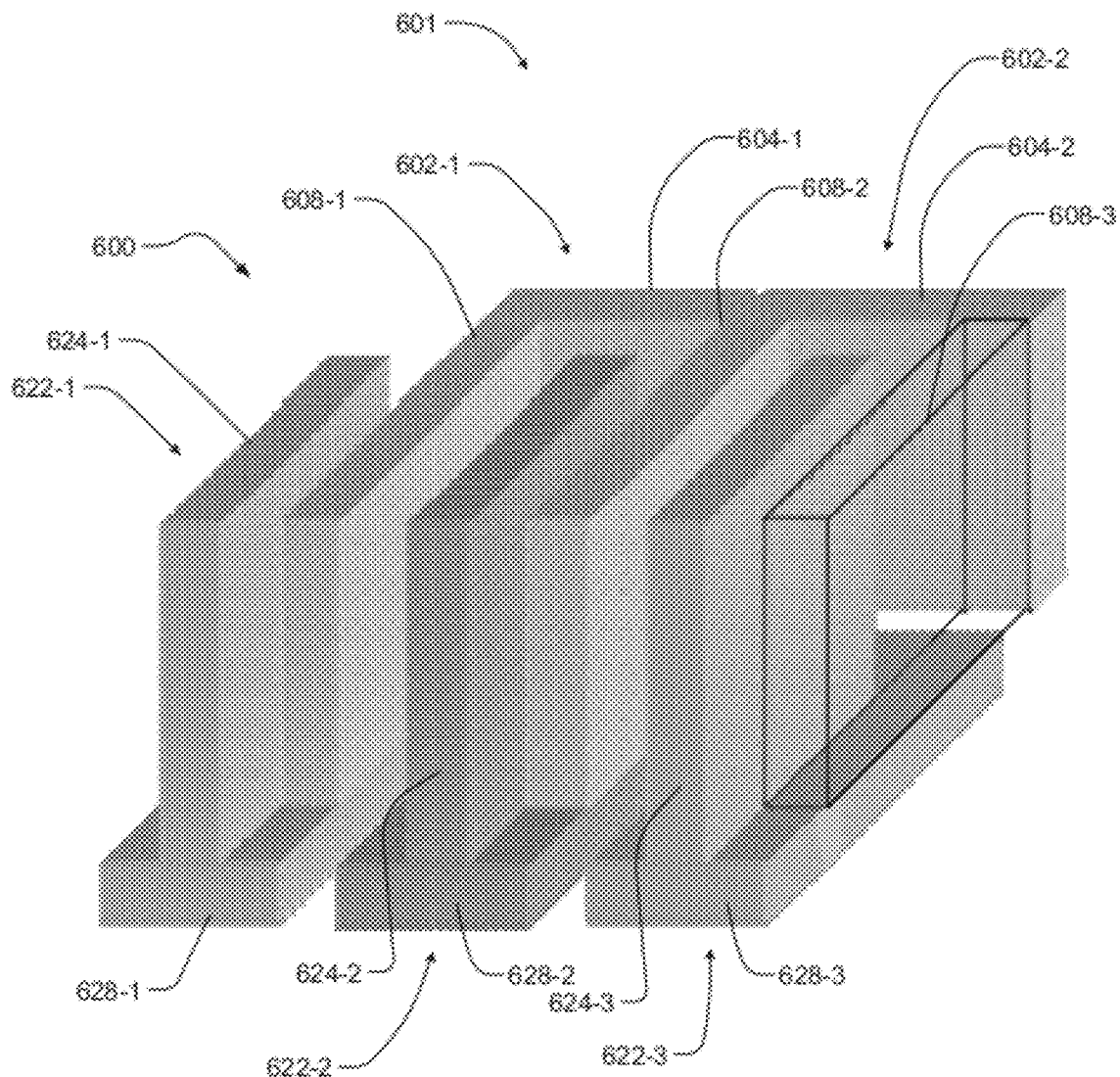
FIG. 14 is a perspective view illustrating another finger MOM capacitor according to the present disclosure.

Referring now to FIG. 14, a finger MOM capacitor 600 according to the present disclosure is shown. The finger MOM capacitor 600 includes a finger structure 601 with a plurality of first conducting structures 602-1, 602-2, . . . (collectively first conducting structures 602). Each of the first conducting structures 602-1, 602-2, . . . includes corresponding first portions 604-1, 604-2, . . . (collectively first portions 604) extending in a first plane that are connected to corresponding second portions 608-1, 608-2, 608-3 . . . (collectively second portions 608) extending in a second plane that is perpendicular to the first plane. Adjacent ones of the first conducting structures 602 are connected together at a junction between the first portions 604 and the second portions 608. The first conducting structures 602 can be "L"-shaped. The finger structure 601 may be made in a metal plane above a lowest metal layer used to fabricate the finger MOM capacitor 600. In conventional designs, the finger structure 601 tends to have parasitic capacitance with underlying layers such as substrate or ground well layers.

The finger MOM capacitor 600 further includes a plurality of second conducting structures 622-1, 622-2, . . . (collectively second conducting structures) each including corresponding first portions 624-1, 624-2, . . . (collectively first portions 624) extending in the second plane connected to corresponding second portions 628-1, 628-2, . . . (collectively second portions) extending in a third plane that is perpendicular to the first and second planes. The second conducting structures 622 may be "T"-shaped. Ends of the second portions 628 of the second conducting structures 622 extend under one or both the adjacent ones of the second portions 608. In some examples, the third plane corresponds to the first metal layer used to fabricate the finger MOM capacitor 600. The second portions 628 tend to limit parasitic capacitance that would otherwise occur between the finger structure 601 and underlying layers.

In FIGS. 13 and 14, the finger MOM capacitors 500 and 600 are fabricated in metal and via layers of an integrated circuit. The examples shown in FIGS. 13 and 14 include trench vias to connect adjacent metal layers. However, spaced hole vias may be used in a manner similar to that shown in FIG. 5 or 8.

Figure 15:
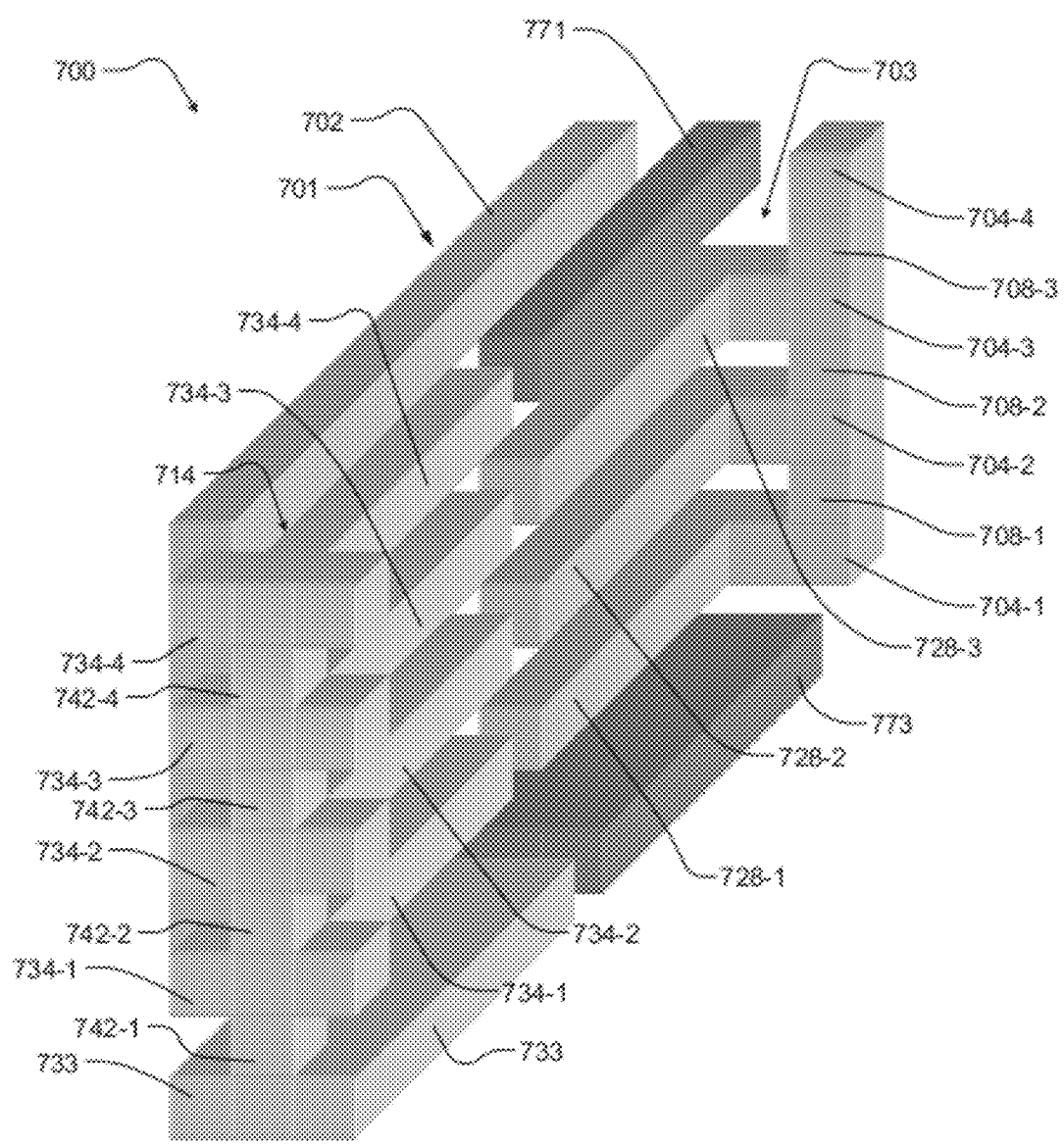
FIG. 15 is a partial perspective view illustrating another finger MOM capacitor according to the present disclosure.
Figure 16:
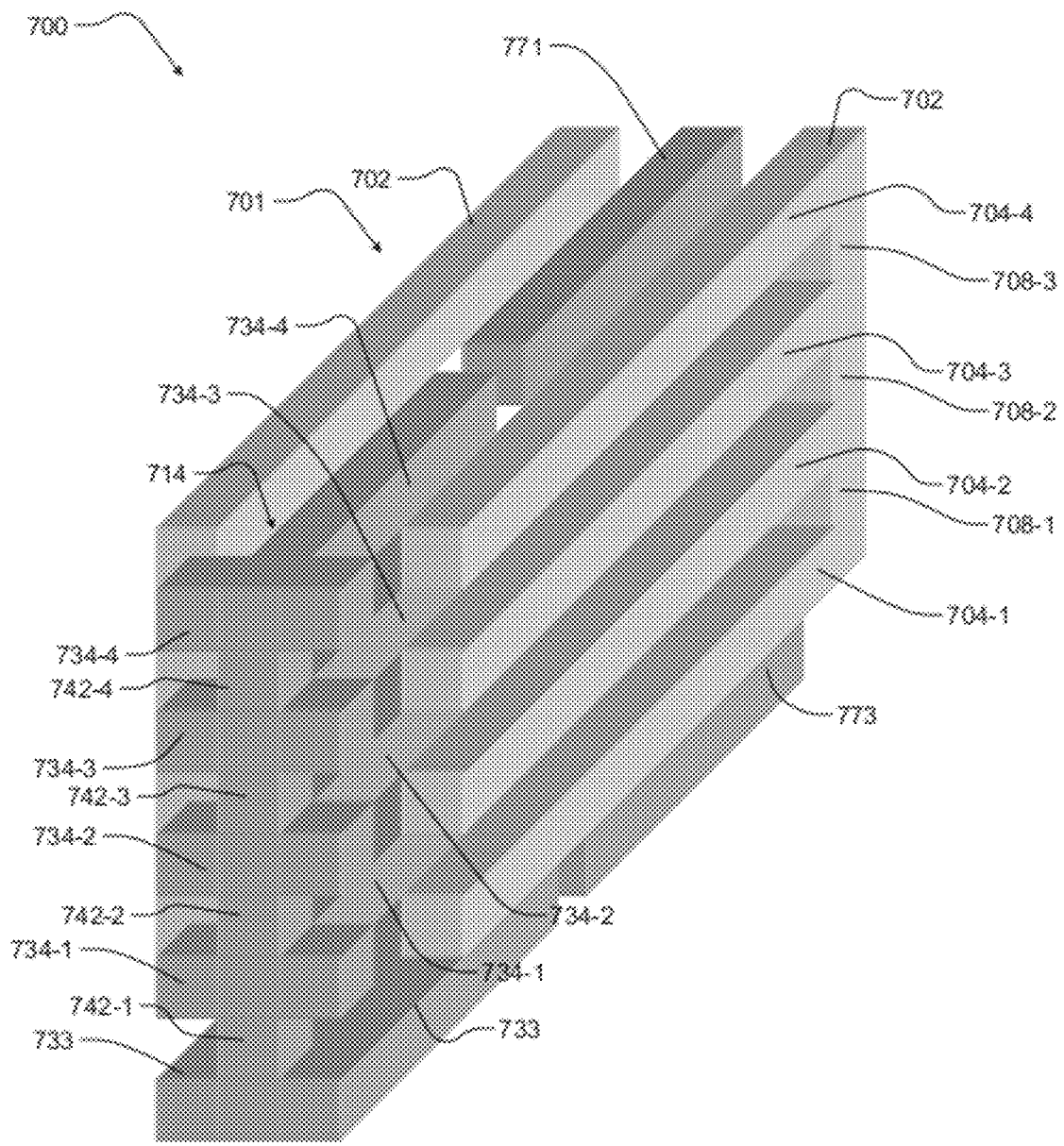
FIG. 16 is a perspective view illustrating the finger MOM capacitor of FIG. 15.
Figure 17:
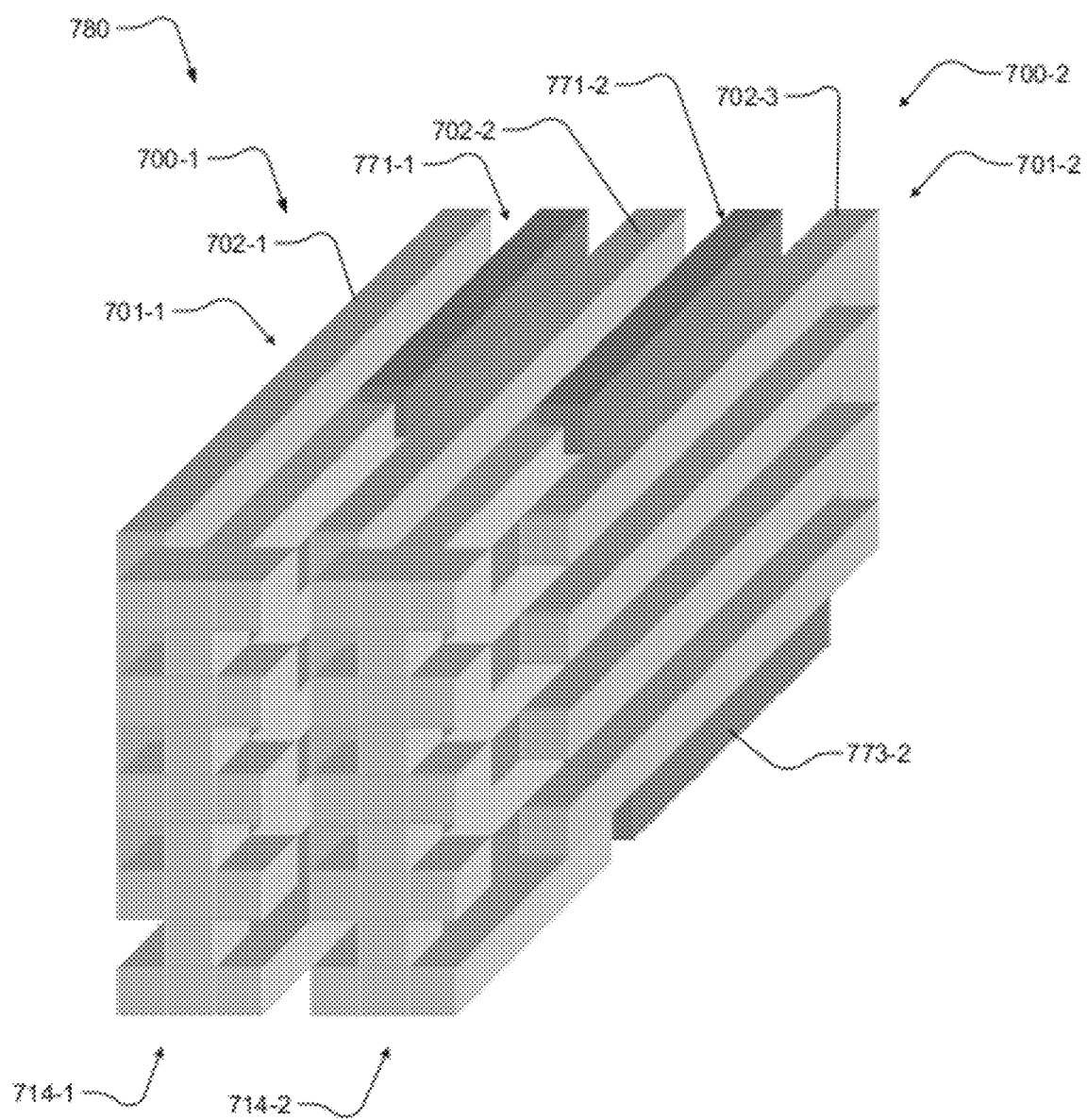
FIG. 17 is a perspective view illustrating the finger MOM capacitor of FIG. 15 arranged in an array according to the present disclosure.

Referring now to FIGS. 15-17, a finger MOM capacitor 700 according to the present disclosure is shown. In FIG. 15, the finger MOM capacitor 700 includes an outer conducting structure 701 including a first side portion 702 (and a corresponding second side portion 702 (best seen in FIG. 16)) that are connected by a middle portion 703. In FIG. 16, each of the first and second side portions 702 includes elongate conducting sections 704-1 (in M2), 704-2 (in M3), 704-3 (in M4), and 704-4 (in M5) (collectively conducting sections 704) with connecting hole vias 708-1 (in VIA2), 708-2 (in VIA3), and 708-3 (in VIA4) (collectively hole vias 708). While five metal layers are shown, additional or fewer metal layers and intervening via layers may be used. While a single column of the hole vias 708 is shown, one or more columns of hole vias may be used. The column of hole vias is arranged at an end of the elongate conducting sections 704.

In FIG. 15, the middle portion 703 includes "T"-shaped sections 728-1 (in M2), 728-2 (in M3), and 728-3 (in M4) (collectively "T"-shaped sections 728) that connect to the elongate sections 704-1 (in M2), 704-2 (in M3), and 704-3 (in M4), respectively.

An inner conducting structure 714 includes a rectangular section 733, "T"-shaped sections 734-1 (in M2)), 734-2 (in M3), 734-3 (in M4) and 734-4 (in M5) (collectively "T"-shaped sections 734), and connecting hole vias 742-1 (in VIA 1), 742-2 (in VIA2), 742-3 (in VIA3), and 742-4 (in VIA4) (collectively hole vias 742). While a single column of the hole vias 742 is shown, one or more columns may be used. The column of hole vias 742 is arranged at a junction of the "T" in the "T"-shaped sections 734.

A finger section 771 and a rectangular section 773 extend above and below the "T"-shaped sections 728-1, 728-2 and 728-3 and in line with the "T"-shaped section 734-4 and the rectangular section 733, respectively. The finger section 771 and the rectangular section 773 may be connected to a low impedance reference. The inner conducting structure 714 is connected to one capacitor input and the outer conducting structure is connected to another capacitor input.

In FIG. 17, the MOM capacitor 700 is arranged in an array 780 with side walls shared with adjacent ones of the MOM capacitors. In the example in FIG. 17, the array 780 includes two MOM capacitors 700-1 and 700-2 each with outer conducting structures 701-1 and 701-2 and inner conducting structures 714-1 and 714-2, respectively. The MOM capacitor 700-1 includes side portions 702-1 and 702-2. The MOM capacitor 700-2 includes side portions 702-2 and 702-3, where the side portion 702-2 is shared with the MOM capacitor 700-1. The finger section 771-1 is arranged between the side portions 702-1 and 702-2. The finger section 771-2 is arranged between the side portions 702-2 and 702-3.

Figure 18:
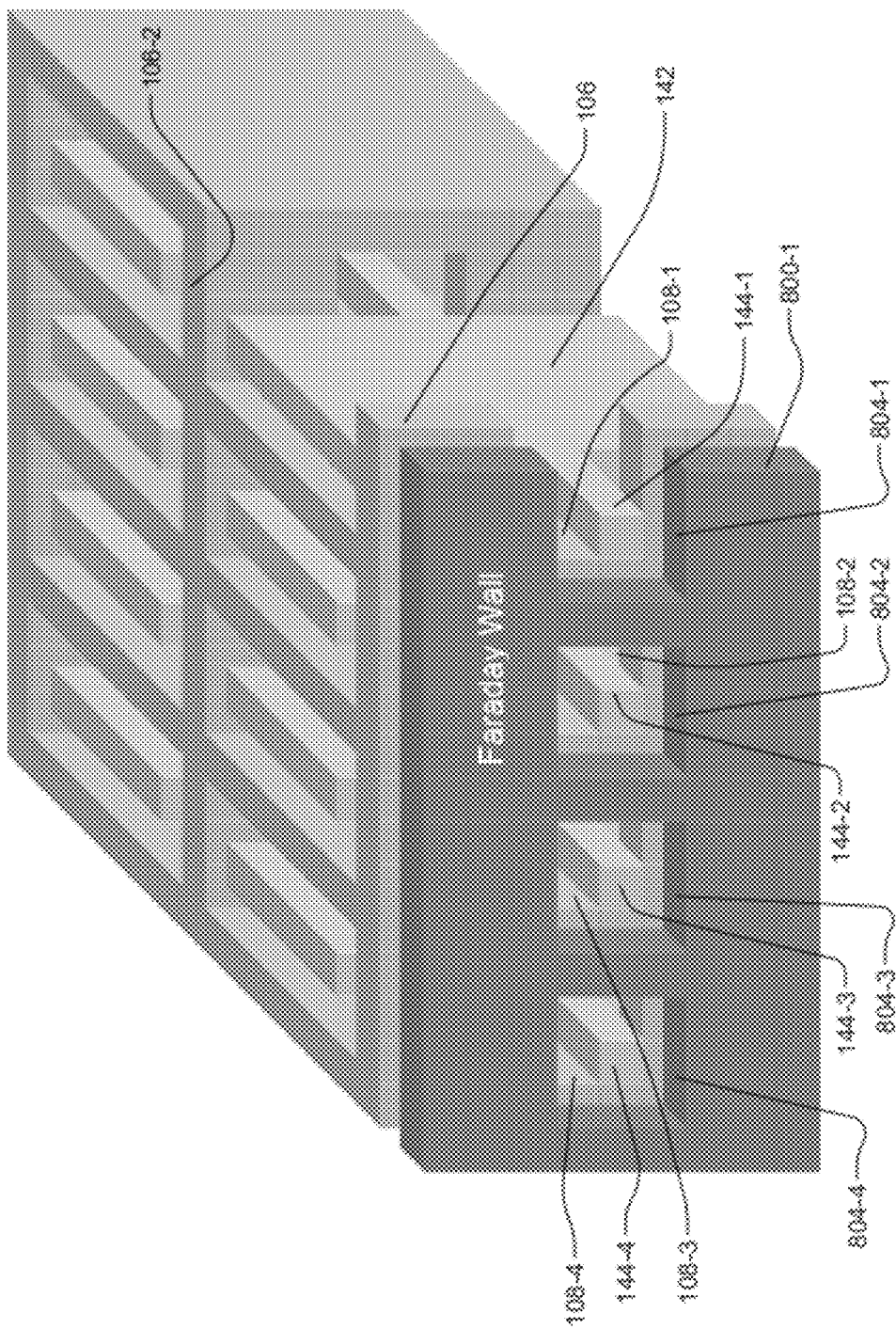
FIG. 18 is a partial perspective view illustrating the MOM capacitor array of FIG. 5 including a Faraday wall according to the present disclosure.
Figure 19:
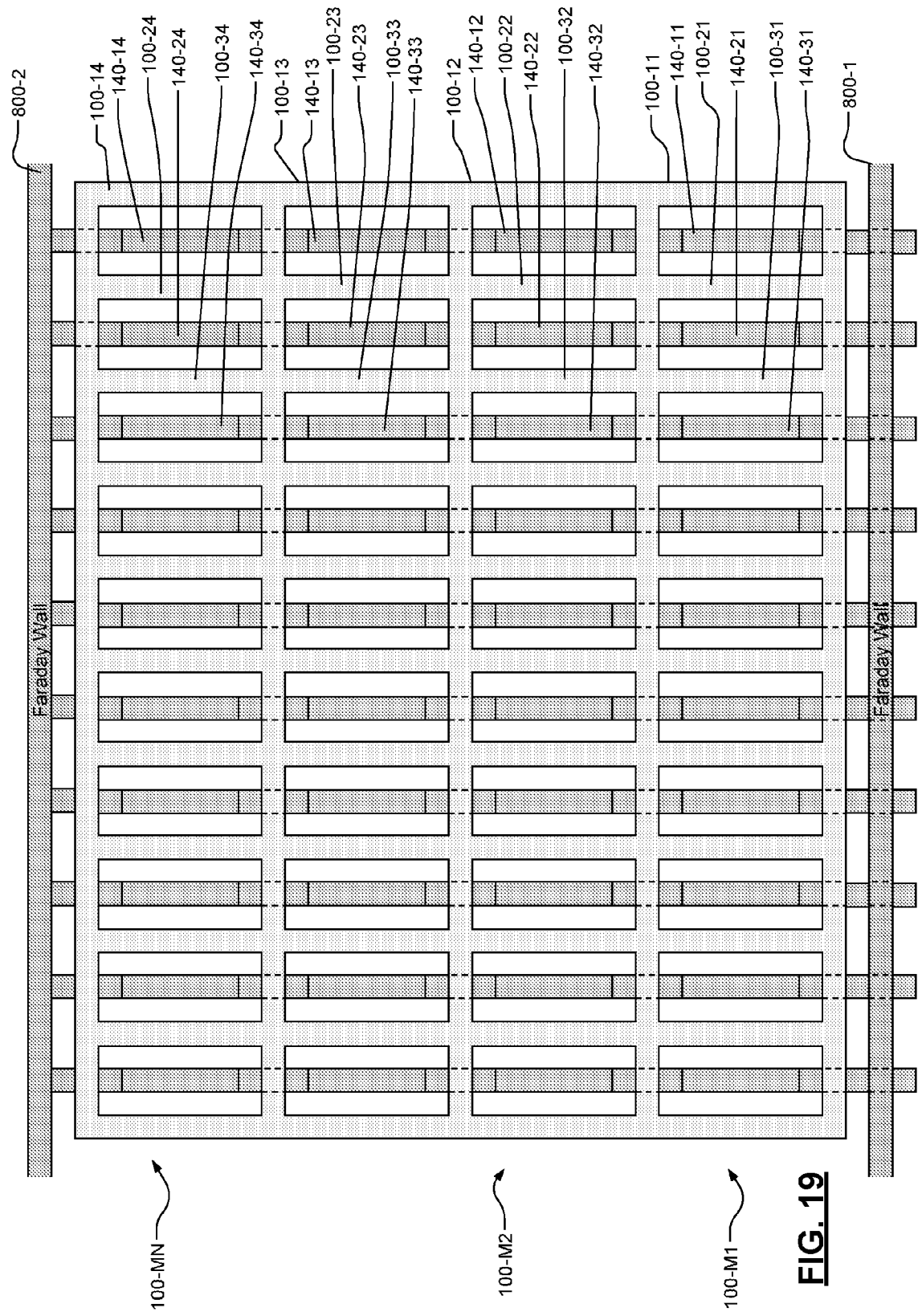
FIG. 19 is a plan view illustrating the MOM capacitor array of FIG. 18.

Referring now to FIGS. 18-19, the MOM capacitor array of FIG. 3 is shown with Faraday walls 800-1 and 800-2 according to the present disclosure. As can be appreciated, Faraday walls can be used in conjunction with any of the other MOM capacitors disclosed herein. The Faraday wall 800-1 is arranged adjacent to the walls 106 and includes openings 804-1, 804-2, 804-3 and 804-4 that align with openings 108-1, 108-2, 108-3 and 108-4, respectively, to allow the conducting extensions 144-1, 144-2, 144-3 and 144-4, respectively, to pass therethrough. Likewise, the Faraday wall 800-2 in FIG. 19 is arranged adjacent to the walls 106 and includes openings 804-1, 804-2, 804-3 and 804-4 that align with openings 110-1, 110-2, 110-3 and 110-4, respectively, to allow the conducting extensions 145-1, 145-2, 145-3 and 145-4, respectively, to pass therethrough. The Faraday walls 800-1 and 800-2 may include conducting extensions in metal layers and trench vias or hole vias in via layers.

As can be seen in FIG. 19, the connections between the MOM capacitors 100 in a column may be varied to adjust the capacitance of the column. Likewise, the connections between capacitors in adjacent columns may be varied to adjust the overall capacitance of an array 182. The inner conducting structures 140-12, 140-13, 140-14, 140-23 and 140-24, respectively associated with MOM capacitors 100-12, 100-13, 100-14, 100-23 and 100-24, respectively are connected to the Faraday wall 800-2. The inner conducting structures 140-34, 140-33, 140-32, 140-31, 140-22, 140-21 and 140-11 associated with MOM capacitors 100-34, 100-33, 100-32, 100-31, 100-22, 100-21 and 100-11, respectively are connected to one input of the capacitor array (connection not shown) through the Faraday wall 800-1. The outer conducting structures 102 for all of the MOM capacitors 100 are connected together and to another input of the capacitor array (connection not shown).

As can be appreciated, the MOM capacitors disclosed herein can be used in any circuit including a capacitor and/or capacitor array. For example only, the MOM capacitors can be used in a successive approximation (SAR) analog to digital converters (ADCs). For example only, the MOM capacitors can be used in a capacitive digital to analog converters (DACs) or a capacitive DACs used in a SAR ADC. Still other implementations are contemplated.

The foregoing description is merely illustrative in nature and is in no way intended to limit the disclosure, its application, or uses. The broad teachings of the disclosure can be implemented in a variety of forms. Therefore, while this disclosure includes particular examples, the true scope of the disclosure should not be so limited since other modifications will become apparent upon a study of the drawings, the specification, and the following claims. For purposes of clarity, the same reference numbers will be used in the drawings to identify similar elements. As used herein, the phrase at least one of A, B, and C should be construed to mean a logical (A or B or C), using a non-exclusive logical OR. It should be understood that steps within a method may be executed in different order without altering the principles of the present disclosure.

What is claimed is:

1. A finger metal oxide metal (MOM) capacitor, comprising:
   an outer conducting structure defined in a plurality of metal layers and a plurality of via layers of an integrated circuit, the outer conducting structure including:
      a first side portion including a plurality of first finger sections extending in the plurality of metal layers and first hole vias connecting the first finger sections;
      a second side portion including a plurality of second finger sections extending in the plurality of metal layers and second hole vias connecting the second finger sections; and
      a middle portion connecting the first and second side portions;
   an inner conducting structure defined in the plurality of metal layers and the plurality of via layers of the integrated circuit, the inner conducting structure including:
      a plurality of "T"-shaped sections defined in the plurality of metal layers and third hole vias connecting the plurality of "T"-shaped sections, wherein middle portions of the plurality of "T"-shaped sections extend towards the middle portion and between the first side portion and the second side portion of the outer conducting structure;
      a plurality of floating finger sections arranged in middle ones of the plurality of metal layers, wherein each one of the floating finger sections
         has a first end adjacent to the middle portion of the outer conducting structure,
         has a second end adjacent to a respective one of the middle portions of the plurality of "T"-shaped sections that is in a same one of the plurality of metal layers as the one of the floating finger sections,
         extends in a lengthwise direction from the first end adjacent to the middle portion of the outer conducting structure towards the second end adjacent to the respective one of the middle portions of the plurality of "T"-shaped sections that is in the same one of the plurality of metal layers, and
         is axially aligned in the lengthwise direction, and coaxial, with the respective one of the middle portions of the plurality of "T"-shaped sections that is in the same one of the plurality of metal layers; and
   oxide arranged between the outer conducting structure and the inner conducting structure.

2. The finger MOM capacitor of claim 1, wherein the middle portion includes conducting sections formed in the middle ones of the plurality of metal layers and fourth hole vias connecting the conducting sections.

3. The finger MOM capacitor of claim 2, further comprising:
   a third finger section and a fourth finger section extending above and below the middle portion, respectively, and connected to a reference impedance,
   wherein the third and fourth finger sections are located in a first one and a last one of the plurality of metal layers, respectively.

4. The finger MOM capacitor of claim 1, wherein a length of the plurality of "T"-shaped sections of the inner conducting structure determines a capacitance of the finger MOM capacitor.

5. A capacitor array comprising:
   a plurality of the finger MOM capacitors of claim 1,
   wherein each of the plurality of finger MOM capacitors share at least one of the first side portion and second side portion with adjacent ones of the plurality of finger MOM capacitors.

6. A digital to analog converter comprising the capacitor array of claim 5.

7. An analog to digital converter comprising the capacitor array of claim 5.

* * * * *